Aug. 11, 1959  H. STATZ  2,899,343

JUNCTION TRANSISTORS AND METHODS FOR MAKING THEM

Original Filed May 27. 1954

INVENTOR
HERMANN STATZ

BY Elmer J. Gorn
ATTORNEY

United States Patent Office 2,899,343
Patented Aug. 11, 1959

2,899,343

JUNCTION TRANSISTORS AND METHODS FOR MAKING THEM

Hermann Statz, Wayland, Mass.

Continuation of application Serial No. 432,644, May 27, 1954. This application September 16, 1957, Serial No. 684,053

11 Claims. (Cl. 148—1.5)

This application is a continuation of my prior copending application, Serial No. 432,644, filed May 27, 1954, now abandoned, and assigned to the same assignee as the present application.

This invention relates to junction transistors having narrow base regions with the concentration of the normal impurity in the base region having a gradient and methods for making such transistors.

One of the limitations on the use of transistors, particularly junction transistors at radio frequencies, is the rapid falling off of the gain of the device with increasing frequency. This is in part due to the transit time of the minority carriers through the base region. This transit time decreases as the square of the base width so that the high frequency performance of the junction transistors can be improved by narrowing the base region. It has also been found that the transit time can be reduced by having an electrical field in the base region. Such a field can be created by an impurity gradient in the base region with the highest concentration on the emitter side of the region. Ideally, the concentrations should vary as a linear function of the hyperbolic sine of the distance from the emitter junction to be most effective. By this invention, such narrow base regions having such impurity gradients can be produced by a diffusion process.

Ordinary junction transistors, as produced by the grown crystal method, start by the growing of a high resistivity crystal of a semiconductor from the fourth group of elements in the periodic table, usually germanium. The crystal can be grown by such a method as the Czochralski method described in an article entitled "Preparation of Germanium Single Crystals" by Louise Roth and W. E. Taylor in the November 1952 Proceedings of the I.R.E., volume 40, No. 11, beginning at page 1338. Briefly, an ingot of pure germanium or other semiconductor from the fourth group of elements in the periodic table is melted in a crucible. In the case of germanium, this crucible is preferably made of graphite. A very small percentage of a doping agent from either the third or fifth group of elements in the periodic table having a high diffusion constant is added to the melt. A seed crystal of germanium is lowered into the melt and as it grows is extracted. When the desired collector region is produced, a doping agent imparting the opposite type of conductivity is added to the melt to produce the base region. After the crystal has grown for a sufficient time to form the desired thickness of the base region, the doping agent of the type that predominates in the first region is added to form a region having the type of conductivity of the first region to give a junction transistor. By this method, it is not practicable to form base regions of a thickness less than one thousandth of an inch, nor can the doping agent concentration in this region be controlled as to gradient.

By the method of the invention a crystal of the desired semiconductor material is grown by the above-described method to produce a first or collector region. When the desired first collector region has been produced, additional doping agents from both the third and fifth groups of elements from the periodic table are added to the melt to give a concentration of the two types of doping agents that have a proportion of at least fifteen to one. The doping agents selected must have diffusion constants in the semiconductor body used at the temperature to be used for subsequent heat treatment that differ considerably and preferably by a factor of one hundred or more. The doping material that is to predominate in the base region of the completed junction transistor should have the higher diffusion constant. This portion of the crystal forms the emitter region of the completed transistor. The cooled crystal after final shaping is again heated to a temperature below its melting point and the doping agent of lesser concentration but with the greater diffusion constant at this temperature diffuses into the collector region to form a region of the opposite type of conductivity that can be used as the base of the resulting transistor. The thickness of the base region, which may be on the order of $2\times10^{-4}$ inches, can be controlled by the selection of the diffusion constants of the doping agents, the relative concentrations of these doping agents in the emitter region of the transistor, the temperature to which the crystal is heated and the length of time it is held at that temperature. These factors also determine the way in which the concentration of the dominant doping agent in the base region varies with distance from the emitter to the collector.

The foregoing and other advantages of this invention will be better understood from the following description taken in conjunction with the accompanying drawings wherein.

Figure 1:
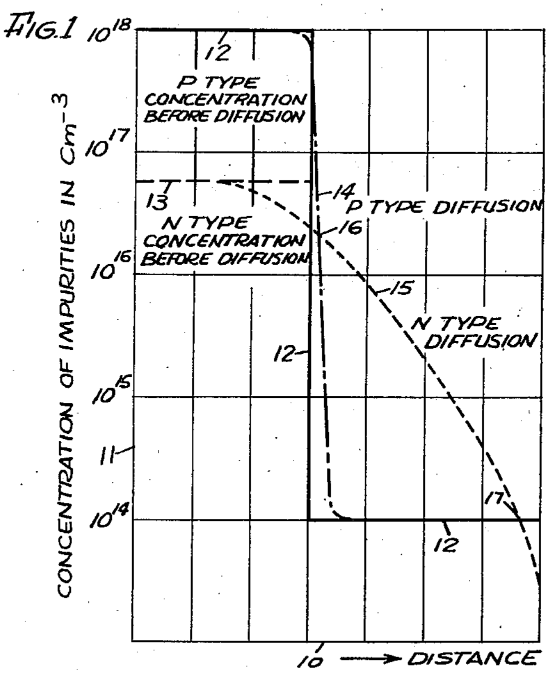
Fig. 1 is a plot of the concentration of N- and P-type material with respect to the axial distance in the crystal before and after diffusion.
Figure 2:
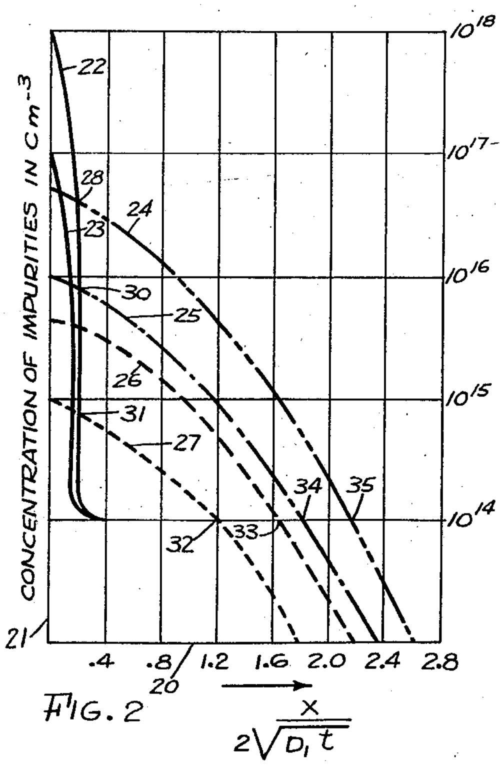
Fig. 2 is a series of plots of the concentration of N- and P-type material with respect to the axial distance in the crystal after diffusion.
Figure 3:
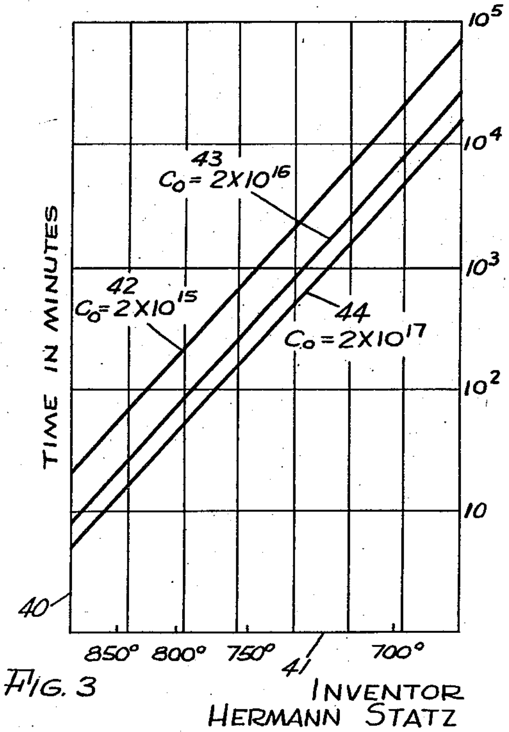
Fig. 3 is a series of graphs of the variation of diffusion time with temperature to create a base region one thousandth of an inch thick with different initial concentrations of doping agents.

The manner in which the heat treatment of the semiconductor crystal formed in the manner described above produces a junction transistor with a thin base region, having a decreasing concentration of the doping agent that imparts the desired type of conductivity, can be best understood by reference to Figs. 1, 2, and 3.

In Fig. 1, initial concentrations are shown for either indium or gallium (both P-type materials) and either arsenic or antimony (both N-type materials) in different parts of a longitudinal section through the semiconductor both before and after heat treatment. The axial distance from the emitter on the left to the collector on the right is plotted horizontally along the line 10. The concentration of doping agent in parts per cubic centimeter is plotted logarithmically vertically along the line 11. The initial concentration of the P-type impurity obtained by the process described above is shown in the heavy solid line 12. It will be noted that the concentration of P-type material starts at the emitter with a concentration of $10^{18}$ atoms per cc. and drops sharply at the junction to a concentration of $10^{14}$ atoms per cc. in the collector region along the curve 12; while the N-type material starts at the emitter with a concentration of $5\times10^{16}$ atoms per cc. and drops sharply at the junction along the dashed line 13 to a negligible concentration of $10^{14}$ atoms per cc. in the collector region. When the body is heated to 900 degrees C., the two impurity materials diffuse from the region of high concentration to the region of low concentration at different rates. This is shown in the case of the P-type material by the dot-dashed curve 14, and for the case of the N-type material by the light dotted line 15. Beginning at a point 16, the N-type material has a higher concentration than the P-type material. This N-type concentration continues to decrease until at a point 17 the P-type material again predominates. Thus the region of the crystal between the points 16 and 17 is the base region. The gradually decreasing concentration of the N-type material gives the desired concentration gradient. The initial concentration of the P and N-type materials is determined by the desire for a large gradient of concentration in the base region; a high concentration at the emitter side and a low concentration at the collector side. However, a high concentration at the emitter side reduces emitter efficiency. For this reason the concentration of the P-type material at the junction should be larger than that for the N-type material by a factor of at least 15. The maximum concentration of the N-type material is limited by the solid solubility of the P-type material used. Furthermore, a minimum concentration of P-type material at the collector side is desirable. A reasonable value has been found to be $10^{14}$ cm.$^{-3}$, as shown in Fig. 1. Fig. 1 is for the production of a P–N–P type of junction. For an N–P–N type of junction, the N-type of impurity would initially have on the order of 15 times the concentration of the P-type of impurity and the P-type of impurity would have a much greater diffusion constant than the N-type of material preferably by a factor on the order of 100.

The graphs of Fig. 2 show how the thickness of the base region can be varied by varying the initial concentrations of the two doping agents in the semiconductor. As in Fig. 1, the axial distance from the emitter on the left to the collector on the right is plotted horizontally along the line 20. Actually this distance has been normalized in a manner to be explained later. The concentration of each impurity or doping agent in atoms per cc. is plotted vertically along the line 21. The concentration of the diffused P-type material is shown by the heavy solid line 22 starting at a concentration of $10^{18}$ atoms per cc. and rapidly falling to a concentration of $10^{14}$ atoms per cc. The concentration of P-type impurity of a second example is shown by curve 23 starting at a concentration of $10^{17}$ atoms per cc. and rapidly falling to the same final concentration as the first example. The concentration of N-type material is shown by curves 24, 25, 26, and 27 for several examples. It will be seen that these curves start at successively lower concentrations. It will be further seen that those starting at higher concentrations produce wider base areas as shown by the distance measured horizontally from the point where each curve intersects the vertical region of the curve for its associated P-type material concentration, curves 22 and 23 at points 28, 30, and 31 and the intersection of the N-type concentration curves with the horizontal curves 22 and 23 for the P-type materials at points 32, 33, 34, and 35.

As has been stated above, the relationship between the diffusion constants for the doping materials used is a very important factor in the operation of this method. Representative diffusion constants for doping materials in square cm. per second are as follows:

| Acceptors (P-type) | Donors (N-type) |
|---|---|
| Gallium $3\times10^{-12}$ | Phosphorus $8\times10^{-11}$ |
| Indium $2\times10^{-13}$ | Arsenic $2\times10^{-10}$ |
| | Antimony $2\times10^{-10}$ |

With a given initial concentration $C_0$ the final concentration C will be $$C=\frac{C_0}{2}\left(1-erf\frac{X}{2\sqrt{D_1t}}\right)$$

Where *erf* represents the error function and X the distance from the emitter region, $D_1$ the diffusion constant of the faster material and *t* the time for which the semiconductor body is held at the temperature used for the process. How this temperature is determined will be discussed later. In Fig. 2 the horizontal axis is actually plotted in term of $$\frac{X}{2\sqrt{D_1t}}$$

to give a better basis of comparison for different materials. By manipulating the above formula, the time required to produce the desired final concentration of each doping material and the desired thickness of the base region can be determined. For example, by using either antimony or arsenic as the N-type material, each with a diffusion constant of $2\times10^{-10}$ cm.$^2$/sec. at 900° C. with an initial concentration of $2\times10^{17}$ cm.$^{-3}$, a base width $1\times10^{-3}$ cm. or $0.433\times10^{-3}$ inches can be obtained in 5.2 minutes. If the initial concentration is decreased to $2\times10^{16}$ per cc. the same thickness of base area will require 8.14 minutes.

However, the diffusion constant is temperature dependent. In the case of antimony or arsenic, this temperature dependence can be represented by the formula $$D=D_0\ \text{exp.}\left(\frac{-\Delta E}{KT}\right)$$

where $D_0$ is the diffusion constant at normal temperature, K is Boltzmann's constant, T is the absolute temperature in degrees C and $\Delta E$ is the activation energy, in this case approximately 2.5 electron volts.

Fig. 3 shows the variation of the time plotted vertically along the line 40, required to form a base region of one thousandth of a cm. thick using an N-type material having a diffusion constant of $2\times10^{10}$ cm.$^2$/sec. at a temperature of 900° C. while holding the material at various temperatures plotted horizontally along the line 41. The lines 42, 43, and 44 represent an initial concentration of $2\times10^{15}$, $2\times10^{16}$, $2\times10^{17}$, respectively. It will be noted that the time required varies inverselv with temperature and initial concentration.

The diffusion constants of the N- and P-type materials used should preferably have a ratio of at least 100 to 1 in order that the region between the initial emitter region and the beginning of the base region will be small, that is, less than 10 percent of the thickness of the base region.

The process of the invention will give base regions having a very small width that can be readily controlled when used with any of the semiconductor materials in the fourth group of the periodic table, preferably germanium or silicon and doping materials selected from either the third or the fifth group. The gradient of the concentration of the dominant doping material in the base region can be controlled by selecting a P-type material with the proper solubility in the semiconductor.

Figure 4:
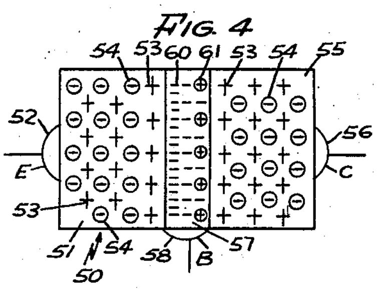
Fig. 4 is a schematic representation of a P–N–P junction transistor made by the methods of the invention.

Fig. 4 shows schematically a junction transistor made by the methods of the invention. Reference numeral 50 designates the semiconductor body of the transistor. The left-hand region 51 represents the emitter region connected to an external circuit by a terminal 52. The positive minority carriers or holes of the P-type material of the emitter are indicated by plus marks 53. The acceptor atoms of the doping agent present in the semiconductor that produce these holes are indicated by the negative signs enclosed in circles 54. The right-hand region 55 represents the collector region connected to the external circuit by a terminal 56. Again, positive minority carriers or holes are indicated by the plus signs 53 and the acceptor atoms in the semiconductor are indicated by negative signs enclosed within circles 54. The narrow central area 57 represents the base region which is connected to the external circuit by a terminal 58. The free electrons are represented by the negative sign 60 and the donor atoms of the doping agent present in the semiconductor that produce the electrons are represented by plus signs within circles 61. It will be noted that there are more free electrons in the left-hand side of the base region 57 than on the right-hand side. This represents the impurity concentration gradient of the base region discussed above. This gradient produces a field that aids in the migration of holes. For this purpose it is best if the gradient is a linear function of the hyperbolic sine of the distance. However, an approximation of this shape is sufficient.

Figure 5:
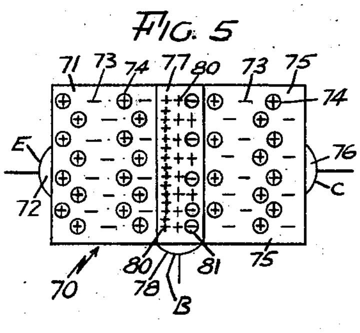
Fig. 5 is a schematic representation of an N–P–N junction transistor made by the methods of the invention.

Fig. 5 shows schematically an N-P-N junction transistor made by the methods of the invention. Reference numeral 70 designates the semiconductor body of the transistor. The left-hand region 71 represents the emitter region connected to the external circuit by a terminal 72. In this case, the minority carriers are designated as negative charges or free electrons by negative signs 73. The donor atoms in the semiconductor are indicated by the positive signs enclosed in circles 74. The right-hand region 75 represents the collector region connected to the external circuit by a terminal 76. Again the negative minority carriers or electrons are indicated by negative signs 73 and the donor atoms in the semiconductor are indicated by positive signs enclosed within circles 74. The narrow central area 77 represents the base region which is connected to the external circuit by a terminal 78. The holes are represented by the positive signs 80 and the acceptor atoms in the semiconductor are represented by negative signs enclosed in circles 81. The gradient of concentration of the holes 80 in the base region 77 will again be noted. Thus the method of the invention produces both P-N-P and N-P-N junction transistors.

Junction transistors of the type described may be produced by controlling the cooling rate of the crystal as it is formed after the doping step. A proper rate of cooling at this stage may be substituted under certain conditions for the heat treating step described above.

This invention is not limited to the particular details of construction, materials and processes described, as many equivalents will suggest themselves to those skilled in the art. It is, accordingly, desired that the appended claims be given a broad interpretation commensurate with the scope of the invention within the art.

What is claimed is:

1. The method of making a semiconductor device, said method comprising growing a length of crystal from a melt of semiconductor material having a concentration of a first electrical conductivity type determining impurity therein to form a first region in said crystal in which said first type impurity is the predominant impurity, introducing a concentration of a second electrical conductivity type determining impurity and an additional concentration of said first type impurity into said melt, the concentration of said second type impurity being insufficient to overcome the concentration of said first electrical conductivity type determining impurity in a subsequently grown portion of said crystal, said first and second type impurities having substantially different diffusion constants, continuing the growth of said crystal to form a second region therein in which both types of said impurities are present but in which the concentration of said first type impurity is greater than the concentration of said second type impurity, maintaining said crystal at a temperature below the melting point of said crystal for a time sufficient to cause said second type impurity to diffuse within said crystal to convert a portion of at least one of said regions into a third region intermediate said first two regions in which the concentration of said second type impurity predominates over the concentration of said first type impurity, and establishing electrical connections to each of said regions.

2. The method of making a semiconductor device, said method comprising growing a length of crystal from a melt of semiconductor material having a concentration of a first electrical conductivity type determining impurity therein to form a first region in said crystal in which said first type impurity is the predominant impurity, introducing a concentration of a second electrical conductivity type determining impurity and an additional concentration of said first type impurity into said melt, the concentration of said second type impurity being insufficient to overcome the concentration of said first electrical conductivity type determining impurity in a subsequently grown portion of said crystal, said first and second type impurities having substantially different diffusion constants, continuing the growth of said crystal to form a second region therein in which both types of said impurities are present but in which the concentration of said first type impurity is greater than the concentration of said second type impurity, maintaining said crystal at a temperature below the melting point of said crystal for a time sufficient to cause said second type impurity to diffuse within said crystal to convert a portion of at least one of said regions into a third region intermediate said first two regions in which the concentration of said second type impurity predominates over the concentration of said first type impurity, dividing said crystal into smaller bodies each containing said three regions, and establishing electrical connections to each of said regions.

3. The method of making a semiconductive device, said method comprising growing a length of crystal from a melt of semiconductive material having a concentration of a first electrical conductivity type determining impurity therein to form a first region in said crystal in which said first type impurity is the predominant impurity, introducing an additional concentration of said first type impurity and a concentration of a second electrical conductivity type impurity into said melt, the concentration of said second type impurity being greater than the concentration of said first type impurity originally in said melt, but less than the combined concentration of said first type impurities after said additonal amount has been added to said melt, said second type impurity having a much higher diffusion constant than said first type impurity, continuing the growth of said crystal to form a second region in said crystal in which both types of said impurity are present but in which the concentration of said first type impurity is greater than the concentration of said second type impurity, maintaining said crystal at a temperature below the melting point of said crystal for a time sufficient to cause said second type impurity to diffuse in said crystal to convert a portion of at least one of said regions into a third region intermediate said first two regions in which the concentration of said second type impurity predominates over the concentration of said first type impurity, and establishing electrical connections to each of said regions.

4. The method of making a semiconductive device, said method comprising introducing a concentration of a first electrical conductivity type determining impurity into a melt of semiconductive material selected from the group consisting of germanium and silicon, growing a length of crystal from said melt to form a first region, introducing a concentration of a second electrical conductivity type impurity and an additional concentration of said first type impurity into said melt, the concentration of said second type impurity being insufficient to overcome the combined concentration of said first type impurity originally in said melt and said added first impurity in a subsequently grown portion of said crystal, said second type impurity having a much higher diffusion constant than said first type impurity, continuing the growth of said crystal to form a second region containing both of said impurities but in which said first type impurity predominates, maintaining said crystal below the melting point of said crystal for a time sufficient to cause said second impurity material to diffuse within said solid crystal to form a third region in which the concentration of said second type impurity predominates over the concentration of said first type impurity, and establishing electrical connections to each of said regions.

5. The method of making a semiconductive device, said method comprising growing a length of crystal from a melt of semiconductive material having a concentration of a first electrical conductivity type determining impurity therein to form a first region in said crystal in which said first type impurity is the predominant impurity, introducing a concentration of a second electrical conductivity type determining impurity and an additional concentration of said first type impurity into said melt, said concentration of said second type impurity being insufficient to overcome the combined concentration of said first type impurities in a subsequently grown portion of said crystal, said second type impurity having a much higher diffusion constant than said first type impurity, interrupting the growth of said crystal, resuming the growth of said crystal to form a second region in said crystal in which both of said impurity types are present but in which the concentration of said first type impurity is greater than the concentration of said second type impurity, maintaining said crystal at a temperature below the melting point of said crystal for a time sufficient to cause said second type impurity to diffuse within said crystal to convert a portion of at least one of said regions into a third region intermediate said first two regions in which the concentration of said second type impurity predominates over the concentration of said first type impurity, and establishing electrical connections to each of said regions.

6. The method of making a semiconductive device, said method comprising growing a length of crystal from a melt of semiconductive material having a concentration of a first electrical conductivity type determining impurity therein to form a first region in said crystal in which said first type impurity is the predominant impurity, introducing a concentration of a second electrical conductivity type determining impurity and an additional concentration of said first type impurity into said melt, the concentration of said second type impurity being greater than the concentration of said first type impurity, said second type impurity originally in said melt, but less than the combined concentration of said first type impurities after said additional amount has been added to said melt having a much higher diffusion constant than said first type impurity, continuing the growth of said crystal to form a second region in said crystal in which both of said impurities are present but in which the concentration of said first type impurity is greater than said second type impurity, maintaining said crystal at a temperature below the melting point of said crystal for a time sufficient to cause said second type impurity to diffuse from said second region into said first region to form a third region intermediate said first two regions in which the concentration of said second type impurity predominates over the concentration of said first type impurity, and establishing electrical connections to each of said regions.

7. The method of making a semiconductive device, said method comprising growing a length of crystal from a melt of semiconductive material having a concentration of a first electrical conductivity type determining impurity therein to form a first region in said crystal in which said first type impurity is the predominant impurity, doping said melt with an additional amount of said first type impurity and with a lesser amount of a second electrical conductivity type determining impurity, the amount of said second type impurity being greater than the amount of said first type impurity originally in said melt, but less than the combined amounts of said first type impurity after said additional amount of said first type impurity has been added to said melt, said second type impurity having a much higher diffusion constant in said semiconductor material than said first type impurity, continuing the growth of said crystal to form a second region in said crystal containing both types of said impurities but in which said first type impurity predominates, maintaining said crystal at a temperature below the melting point of said crystal for a time sufficient to cause said second type impurity to diffuse into said first region containing only said first type impurity to form a third region in said crystal intermediate said first two regions in which said second type impurity predominates in a varying concentration across said third region, and establishing electrical connections to each of said regions.

8. The method of making a semiconductive device, said method comprising growing a length of crystal from a melt of semiconductive material having a concentration of a first conductivity type impurity therein to form a collector region in said crystal, introducing a concentration of a second electrical conductivity type determining impurity and an additional concentration of said first type impurity into said melt, said concentration of said second type impurity being insufficient to overcome the combined concentration of said first type impurity originally in said melt and said added first impurity in a subsequently grown portion of said crystal, said second type impurity having a much higher diffusion constant than said first type, continuing the growth of said crystal to form an emitter region in said crystal in which both of said impurities are present but in which the concentration of said first type impurity is greater than the concentration of said second type impurity, maintaining said crystal at a temperature below the melting point of said crystal for a time sufficient to cause said second type impurity to diffuse within said crystal to create a base region intermediate said collector and emitter regions in which the concentration of said second type impurity predominates over the concentration of said first type impurity, and establishing electrical connections to said emitter, collector and base regions.

9. The method of making a semiconductor crystal suitable for use in semiconductor devices, said method comprising growing a length of crystal from a melt of semiconductive material having a concentration of a first electrical conductivity-type determining impurity therein to form a first region in said crystal in which said first type impurity is the predominant impurity, introducing a concentration of a second electrical conductivity-type determining impurity and an additional concentration of said first impurity type into said melt, the concentration of said second type impurity being insufficient to overcome the combined concentration of said first type impurity and said added impurity of said first type in a subsequently grown portion of said crystal, said first and second type impurities having substantially different diffusion constants, continuing the growth of said crystal to form a second region therein in which both types of said impurities are present but in which the concentration of said first type impurity is greater than the concentration of said second type impurity, maintaining said crystal at a temperature below the melting point of said crystal for a time sufficient to cause said second type impurity to diffuse within said crystal to convert a portion of one of said regions into a third region intermediate said first two regions in which the concentration of said second type impurity predominates over the concentration of said first type impurity.

10. The method of making a semiconductor crystal suitable for use in semiconductor devices, said method comprising growing a length of crystal from a melt of semiconductive material having a concentration of a first electrical conductivity-type determining impurity therein to form a first region in said crystal, introducing a concentration of a second electrical conductivity-type determining impurity and an additional concentration of said first impurity type into said melt, the concentration of said second type impurity being insufficient to overcome the combined concentration of said first type impurity and said added impurity of said first type in a subsequently grown portion of said crystal, said first and second type impurities having substantially different diffusion constants, continuing the growth of said crystal to form a second region therein in which both types of said impurities are present but in which the concentration of said first type impurity is greater than the concentration of said second type impurity, heating said crystal at a temperature below the melting point of said crystal for a time sufficient to cause said second type impurity to diffuse within said crystal to convert a portion of one of said regions into a third region intermediate said first two regions in which the concentration of said second type impurity predominates over the concentration of said first type impurity.

11. The method of making a semiconductor device, said method comprising simultaneously introducing a concentraton of a first electrical conductivity-type determining impurity and a concentration of a second electrical conductivity-type determining impurity into only a portion, a body of semiconductive material containing said first type impurity, the concentration of said second type impurity being less than the concentration of said first type impurity in said portion of said body, maintaining said body at a temperature sufficient to cause simultaneous solid-state diffusion of both types of impurities to create a region in said body in which said second type impurity predominates over said first type impurity, and establishing electrical connections to said body.

References Cited in the file of this patent

UNITED STATES PATENTS

| | | |
|---|---|---|
| 2,785,096 | Adcock | Mar. 12, 1957 |
| 2,793,145 | Clarke | Mar. 12, 1957 |
| 2,818,361 | Anderson | Dec. 31, 1957 |

FOREIGN PATENTS

| | | |
|---|---|---|
| 1,113,385 | France | Dec. 5, 1955 |
| 1,114,367 | France | Dec. 19, 1955 |
| 751,408 | Great Britain | June 27, 1956 |

UNITED STATES PATENT OFFICE

CERTIFICATE OF CORRECTION

Patent No. 2,899,343 August 11, 1959

Hermann Statz

It is hereby certified that error appears in the above numbered patent requiring correction and that the said Letters Patent should read as corrected below.

In the grant, lines 1, 2 and 3, for "Hermann Statz, of Wayland, Massachusetts," read -- Hermann Statz, of Wayland, Massachusetts, assignor to Raytheon Company, a corporation of Delaware, --; line 12, for "Hermann Statz, his heirs" read -- Raytheon Company, its successors --; in the heading to the printed specification, line 4, for "Hermann Statz, Wayland, Mass." read -- Hermann Statz, Wayland, Mass., assignor to Raytheon Company, a corporation of Delaware --; column 4, line 12, for "term" read -- terms --; line 46, for "inverselv" read -- inversely --; column 6, line 44, for "additonal" read -- additional --; column 7, line 49, after "purity" strike out ", said second type impurity --; line 52, after "melt" insert -- , said second type impurity --; column 10, line 5, for "portion, a" read -- portion of a --.

Signed and sealed this 13th day of October 1959.

(SEAL)
Attest:

KARL H. AXLINE
Attesting Officer

ROBERT C. WATSON
Commissioner of Patents